US007561005B2

(12) United States Patent
Harada et al.

(10) Patent No.: US 7,561,005 B2
(45) Date of Patent: Jul. 14, 2009

(54) HIGH FREQUENCY FRONT-END MODULE AND DUPLEXER

(75) Inventors: Tetsuro Harada, Otsu (JP); Masaki Kimura, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/054,666

(22) Filed: Mar. 25, 2008

(65) Prior Publication Data

US 2008/0218927 A1 Sep. 11, 2008

Related U.S. Application Data

(63) Continuation of application No. PCT/JP2006/307639, filed on Apr. 11, 2006.

(30) Foreign Application Priority Data

Sep. 26, 2005 (JP) .............................. 2005-278217

(51) Int. Cl.
*H03H 9/70* (2006.01)
*H03H 9/72* (2006.01)
*H04B 1/44* (2006.01)

(52) U.S. Cl. ............................ 333/133; 455/78; 455/83
(58) Field of Classification Search ................ 333/133; 455/73, 78, 83
See application file for complete search history.

(56) References Cited

U.S. PATENT DOCUMENTS

| 6,750,737 | B2 * | 6/2004 | Uriu et al. ..................... 333/133 |
| 6,870,442 | B1 | 3/2005 | Suzuki et al. |
| 6,882,250 | B2 * | 4/2005 | Uriu et al. ..................... 333/193 |
| 7,023,296 | B2 * | 4/2006 | Uriu et al. ..................... 333/132 |
| 7,057,472 | B2 * | 6/2006 | Fukamachi et al. ......... 333/101 |
| 7,164,306 | B2 * | 1/2007 | Makino ....................... 327/407 |
| 7,295,814 | B2 * | 11/2007 | Yamashita et al. ............ 455/83 |
| 2004/0080378 | A1 * | 4/2004 | Furutani ..................... 333/133 |
| 2004/0127182 | A1 | 7/2004 | Hayashi |
| 2004/0266378 | A1 | 12/2004 | Fukamachi et al. |

FOREIGN PATENT DOCUMENTS

| JP | 2003-18040 A | 1/2003 |
| JP | 2003-289268 A | 10/2003 |
| JP | 2004-135316 | * 4/2004 |
| JP | 2004-187129 | * 7/2004 |
| JP | 2004-297633 | * 10/2004 |
| JP | 2005-64779 A | 3/2005 |

OTHER PUBLICATIONS

Machine translation of JP 2004-187129 published Jul. 2, 2004.*
Machine translation of JP 2004-297633 published Oct. 21, 2004.*
Official communication issued in counterpart International Application No. PCT/JP2006/307639, mailed on Aug. 1, 2006.

* cited by examiner

*Primary Examiner*—Barbara Summons
(74) *Attorney, Agent, or Firm*—Keating & Bennett, LLP

(57) ABSTRACT

A high frequency front-end module includes an antenna terminal ANT, a diplexer, high frequency switches, LC filters, and SAW duplexers. The SAW duplexer is defined by SAW filters and high-pass filters disposed at input sides thereof. The high-pass filters function as phase-matching elements having an anti-surge function against a surge coming from the antenna terminal ANT.

10 Claims, 12 Drawing Sheets

HIGH FREQUENCY FRONT-END MODULE AND DUPLEXER

BACKGROUND OF THE INVENTION

1. Field of the Invention

The present invention relates to high frequency front-end modules and duplexers, and in particular, to a high frequency front-end module that processes a plurality of high frequency transmission and reception signals having different frequency bands and a duplexer for branching reception signals having different frequency bands.

2. Description of the Related Art

In a typical high frequency front-end module of a mobile communication device, such as a cellular phone, surges (electrostatic discharge (ESD): frequencies of approximately 300 MHz) enter through an antenna. Because of this, an anti-surge element is disposed between an antenna terminal and the ground in most cases. Japanese Unexamined Patent Application Publication No. 2003-18040 discloses disposing an inductance element between an antenna terminal and the ground, and Japanese Unexamined Patent Application Publication No. 2003-101434 discloses disposing a varistor between an antenna terminal and the ground. However, an anti-surge element directly attached to an antenna terminal has a fundamental problem of increasing loss of a transmission or reception signal.

For a high frequency front-end module that includes a diplexer for branching a signal of a relatively high pass band of that is equal to or greater than about 1.5 GHz (hereinafter referred to as a high frequency signal on a higher side) and a signal of a relatively low pass band that is equal to or less than about 1.0 GHz (hereinafter referred to as a high frequency signal on a lower side), a surge does not cause a major problem in a signal path for high frequency signals on a higher side because the surge is attenuated by a high-pass filter of the diplexer, whereas a surge may enter a signal path for high frequency signals on a lower side.

In particular, because an element that is sensitive to a surge, such as an acoustic wave filter, is typically disposed in a reception-signal output terminal on the lower side, components for protecting such an element against surges are necessary.

SUMMARY OF THE INVENTION

To overcome the problems described above, preferred embodiments of the invention provide a high frequency front-end module and a duplexer that are capable of preventing a surge from entering a reception-signal output terminal on a lower side without having to dispose an anti-surge element in an antenna terminal.

According to a first preferred embodiment of the invention, a high frequency front-end module processes first and second high frequency transmission and reception signals having different frequency bands, a frequency band of the first high frequency transmission and reception signals being lower than a frequency band of the second high frequency transmission and reception signals. The high frequency front-end module includes a diplexer arranged to branch a first signal path between an antenna terminal and a processor for the first high frequency transmission and reception signals and a second signal path between the antenna terminal and a processor for the second high frequency transmission and reception signals, a first high frequency switch disposed in the first signal path arranged to switch a reception signal path for a first high frequency reception signal of the first high frequency transmission and reception signals and a transmission signal path for a first high frequency transmission signal of the first high frequency transmission and reception signals, an acoustic wave filter disposed in the reception signal path of the first signal path and downstream of the first high frequency switch and having a pass band that allows the first high frequency reception signal to pass therethrough, and a phase-matching element having an anti-surge function disposed between the acoustic wave filter and the first high frequency switch and having both a function of matching a phase between the acoustic wave filter and the first high frequency switch and a function of removing a surge.

In the high frequency front-end module according to the first preferred embodiment of the present invention, because the phase-matching element having an anti-surge function, which has the function of removing a surge, is disposed between the acoustic wave filter and the first high frequency switch, when a surge enters the reception signal path of the first signal path (reception signal path for reception signals of high frequency transmission and reception signals on a lower side) from the antenna, the surge is removed by the phase-matching element having an anti-surge function. Therefore, the acoustic wave filter can be protected against surges without an additional anti-surge element.

In the high frequency front-end module according to the first preferred embodiment of the present invention, the phase-matching element having an anti-surge function may preferably have a function of a high-pass filter including a capacitor and an inductor. If the phase-matching element having an anti-surge function has a pass band that allows the first high frequency transmission and reception signals to pass through and has an attenuation band that is a frequency band of a surge, the phase-matching element having an anti-surge function may be a band-pass filter. However, the transmission loss is reduced by configuring the phase-matching element having an anti-surge function as a high-pass filter.

A cut-off frequency of the high-pass filter may preferably be about 200 MHz to about 600 MHz, for example. Typically, the frequency of a surge is about 200 MHz to about 600 MHz (in particular, approximately 300 MHz), so it is preferable that the cut-off frequency of the high-pass filter is in this frequency band.

By defining the high-pass filter as an LC series resonant circuit arranged between the reception signal path of the first signal path and a ground, a notch function achieved by series resonance is added to the phase-matching element having an anti-surge function, such that an attenuation pole can be produced in the frequency band of a surge. Accordingly, the effects of cutting off surges are further improved.

Alternatively, by defining the high-pass filter as an LC parallel resonant circuit arranged in the reception signal path of the first signal path, the notch function achieved by parallel resonance is added to the phase-matching element having an anti-surge function, such that an attenuation pole can be produced in the frequency band of a surge. Accordingly, the effects of cutting off surges are further improved.

Moreover, the high-pass filter may include a capacitor adjacent to the first high frequency switch and a shunt inductor adjacent to the acoustic wave filter. The capacitor disposed adjacent to the first high frequency switch functions as a capacitor for cutting a direct-current component of the first high frequency switch.

The first high frequency reception signal of the first high frequency transmission and reception signals may further include a first A reception signal and a first B reception signal, the acoustic wave filter may be configured as an acoustic wave duplexer that includes a first acoustic wave filter having a pass band that allows the first A reception signal to pass therethrough and a second acoustic wave filter having a pass band that allows the first B reception signal to pass therethrough, the phase-matching element having an anti-surge function may include a first phase-matching element having an anti-surge function connected to the first acoustic wave filter and a second phase-matching element having an anti-surge function connected to the second acoustic wave filter, the first phase-matching element having an anti-surge function may be set so as to be open to the first B reception signal when viewed from a branch point of the first high frequency switch and the second phase-matching element having an anti-surge function to the first acoustic wave filter, and the second phase-matching element having an anti-surge function may be set so as to be open to the first A reception signal when viewed from a branch point of the first high frequency switch and the first phase-matching element having an anti-surge function to the second acoustic wave filter. That is, the acoustic wave filter may be configured as a duplexer in which two acoustic wave filters having different pass bands are arranged in parallel. In this case, a phase-matching element having an anti-surge function is provided upstream of each of the acoustic wave filters.

The acoustic wave filter can be a surface acoustic wave (SAW) filter or a bulk acoustic wave (BAW) filter. These acoustic wave filters have excellent attenuation characteristics, and each acoustic wave filter is typically a single chip. As a result, in order to integrate the acoustic wave filter and the high frequency switch into a module, the phase-matching element is required to match impedance between the high frequency switch and the acoustic wave filter.

The diplexer, the first high frequency switch, the acoustic wave filter, and the phase-matching element having an anti-surge function may preferably be integrated in a laminated structure in which a plurality of dielectric layers are laminated. The laminated structure may be a multilayer ceramic substrate in which a plurality of ceramic layers are laminated or a multilayer resin substrate in which a plurality of resin layers are laminated. Integrating these functional elements in the laminated structure enables miniaturization of the module. Moreover, the addition of another impedance-matching element can be omitted by providing the impedance matching between the functional elements during the integration.

The acoustic wave filter may typically be a balanced acoustic wave filter including two balanced output terminals, and an impedance-matching element arranged to match impedance between the output terminals is disposed between the two balanced output terminals. The acoustic wave filter, the impedance-matching element, and the phase-matching element having an anti-surge function may preferably be mounted as chip components on the same surface of the laminated structure, and the acoustic wave filter may preferably be disposed between the phase-matching element having an anti-surge function and the impedance-matching element. If a matching element, such as the impedance-matching element and the phase-matching element, is electromagnetically affected by other components, the impedance or phase is displaced, such that predetermined functions are not fully performed. To avoid this, the acoustic wave filter, which has a relatively large size, is disposed between the functional elements, thereby greatly reducing interference between the matching elements.

An LC filter defined by a capacitor and an inductor may preferably be disposed in the transmission signal path of the first signal path, and at least one of the capacitor and the inductor defining the LC filter may preferably be incorporated in the laminated structure, and the capacitor and the inductor may preferably be disposed so as not to overlap the phase-matching element having an anti-surge function in plan view along a laminating direction of the laminated structure. If a transmission signal is sent to the reception signal path of the first signal path, a reception signal cannot be properly processed, and additionally, the acoustic wave filter may be damaged or destroyed. Signal crosstalk can be suppressed by arrangement of the elements defining the LC filter and the phase-matching element having an anti-surge function such that they do not overlap each other in plan view, irrespective of whether the functional elements are disposed internally or externally to the multilayer substrate.

The high-pass filter may be configured as a T-shaped high-pass filter defined by two capacitors disposed in the reception signal path of the first signal path and an inductor connected in shunt between the two capacitors. For a transmission signal and a reception signal in the same system, a transmission-signal band is preferably set to be higher than a reception-signal band. Even if a transmission signal enters the reception signal path, the level at which it enters transmission signal can be reduced to some extent using the high-pass filter disposed downstream (at the reception side) of the high frequency switch. In particular, because attenuation performed by the T-shaped high-pass filter is sharp, the degree of reduction in the signal level is significant.

According to a second preferred embodiment of the present invention, a duplexer for branching a first A reception signal and a first B reception signal having different frequency bands includes a first acoustic wave filter having a pass band that allows the first A reception signal to pass therethrough and a second acoustic wave filter having a pass band that allows the first B reception signal to pass therethrough. The first and second high-pass filters are connected to input sides of the first and second acoustic wave filters, respectively, the input sides receiving the reception signals. The first high-pass filter is set so as to be open to the first B reception signal when viewed from a branch point of the first A reception signal and the first B reception signal to the first acoustic wave filter, and the second high-pass filter is set so as to be open to the first A reception signal when viewed from the branch point to the second acoustic wave filter.

In the duplexer according to the second preferred embodiment of the present invention, because the first acoustic wave filter and the second acoustic wave filter having different pass bands are arranged in parallel, reception signals can be efficiently branched. By configuring the first and second high-pass filters arranged at the input sides for receiving the reception signals as the phase-matching element having an anti-surge function, the surge entering through the antenna can be removed, so the first and second acoustic wave filters can be protected against the surge.

According to preferred embodiments of the present invention, a surge can be prevented from entering a reception-signal output terminal of a processor for first high frequency transmission and reception signals, an acoustic wave filter can be protected against the surge, an anti-surge element can be omitted in an antenna terminal, and signal loss can be avoided. The phase matching function and anti-surge function can be performed without an additional element.

Other features, elements, processes, steps, characteristics and advantages of the present invention will become more

DETAILED DESCRIPTION OF PREFERRED EMBODIMENTS

Preferred embodiments of a high frequency front-end module and a duplexer according to the invention will now be described below with reference to the accompanying drawings.

First Preferred Embodiment

Figure 1:
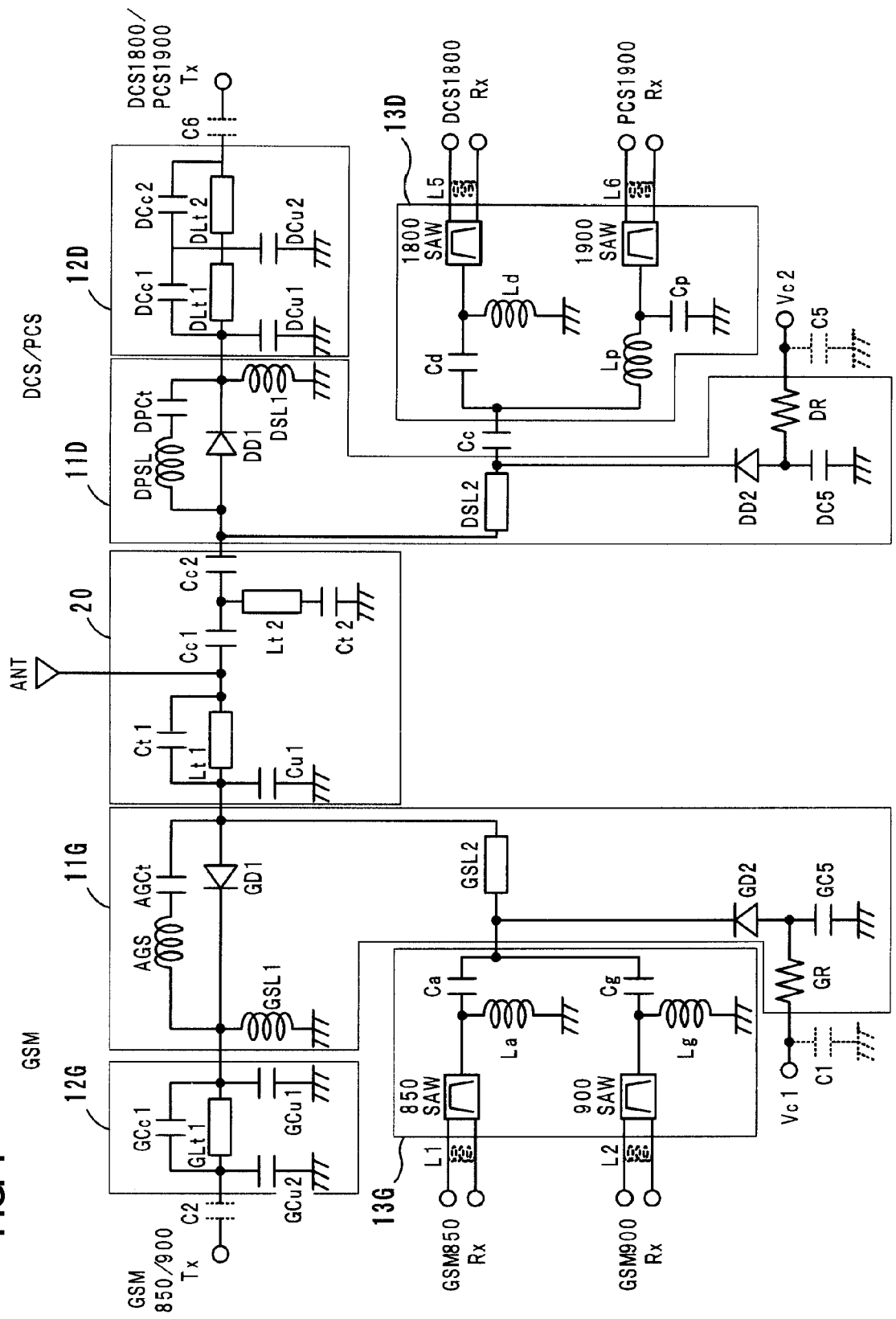
FIG. 1 is an equivalent circuit diagram that illustrates a high frequency front-end module according to a first preferred embodiment of the present invention.

A high frequency front-end module according to a first preferred embodiment is preferably configured as a quad-band high frequency composite component (high frequency front-end module) that supports communication systems of four different frequency bands (GSM850, GSM900, DCS1800, and PCS1900 systems), as shown in an equivalent circuit of FIG. 1.

That is, the high frequency front-end module includes a diplexer 20 that branches a first signal path for GSM850/900 systems and a second signal path for DCS1800/PCS1900 systems, downstream of an antenna terminal ANT. The GSM850/900 systems include a first high frequency switch 11G, a first LC filter 12G, and a surface-acoustic wave (SAW) duplexer 13G. Similarly, the DCS1800/PCS1900 systems include a second high frequency switch 11D, a second LC filter 12D, and a SAW duplexer 13D.

The first high frequency switch 11G selectively switches a signal path between the antenna terminal ANT and a first transmission input terminal GSM850/900Tx and a signal path between the antenna terminal ANT and first reception balanced output terminals GSM850Rx and GSM900Rx. The first LC filter 12G is disposed between the first high frequency switch 11G and the first transmission input terminal GSM850/900Tx. The first SAW duplexer 13G is disposed between the first high frequency switch 11G and the first reception balanced output terminals GSM850Rx and GSM900Rx.

The second high frequency switch 11D selectively switches a signal path between the antenna terminal ANT and a second transmission input terminal DCS1800/PCS1900Tx and a signal path between the antenna terminal ANT and second reception balanced output terminals DCS1800Rx and PCS1900Rx. The second LC filter 12D is disposed between the second high frequency switch 11D and the second transmission input terminal DCS1800/PCS1900Tx. The second SAW duplexer 13D is disposed between the second high frequency switch 11D and the second reception balanced output terminals DCS1800Rx and PCS1900Rx.

During transmission, the diplexer 20 selects a transmission signal from the GSM system or DCS/PCS system and transmits the signal to the antenna terminal ANT. During reception, the diplexer 20 transmits a reception signal received at the antenna terminal ANT selectively to the GSM system or DCS/PCS system.

In the diplexer 20, a parallel circuit (low-pass filter) including an inductor Lt1 and a capacitor Ct1 is disposed between the antenna terminal ANT and the first high frequency switch 11G, and a side adjacent to the first high frequency switch 11G of the parallel circuit is grounded via a capacitor Cu1. Capacitors Cc1 and Cc2 are connected in series between the antenna terminal ANT and the second high frequency switch 11D, and the node of the capacitors Cc1 and Cc2 is grounded via an inductor Lt2 and a capacitor Ct2. That is, the inductor Lt2 and the capacitors Cc1 and Cc2 define a high-pass filter.

In the first high frequency switch 11G, the anode of a diode GD1 is connected to the diplexer 20, and the cathode of the diode GD1 is connected to the first LC filter 12G and is grounded via an inductor GSL1. A series circuit defined by a capacitor AGCt and an inductor AGS is connected in parallel with the diode GD1.

The cathode of a diode GD2 is connected to the diplexer 20 via an inductor GSL2 and to the first SAW duplexer 13G. The anode of the diode GD2 is grounded via a capacitor GC5. The node of the anode of the diode GD2 and the capacitor GC5 is connected to a control terminal Vc1 via a resistor GR. The node of the control terminal Vc1 and the resistor GR is grounded via a capacitor C1.

In the first LC filter 12G, a parallel circuit (low-pass filter) including an inductor GLt1 and a capacitor GCc1 is disposed between the first high frequency switch 11G and the first transmission input terminal GSM850/900Tx. Both ends of the inductor GLt1 are grounded via capacitors GCu1 and GCu2, respectively. A capacitor C2 for cutting a direct-current component is connected between the first LC filter 12G and the first transmission input terminal GSM850/900Tx.

The first SAW duplexer 13G includes SAW filters 850SAW and 900SAW, inductors La and Lg, and capacitors Ca and Cg. The input side of the SAW filter 850SAW is connected to the inductor GSL2 of the first high frequency switch 11G via the capacitor Ca and is grounded via the inductor La. The input side of the SAW filter 900SAW is connected to the inductor GSL2 of the first high frequency switch 11G via the capacitor Cg and is grounded via the inductor Lg.

The output sides of the SAW filters 850SAW and 900SAW are connected to the first reception balanced output terminals GSM850Rx and GSM900Rx via inductors L1 and L2, respectively. The inductors L1 and L2 are arranged to adjust the phases of the first reception balanced output terminals GSM850Rx and GSM900Rx, respectively.

In the second high frequency switch 11D, the anode of a diode DD1 is connected to the diplexer 20 and the cathode of the diode DD1 is connected to the second LC filter 12D and is grounded via an inductor DSL1. A series circuit including a capacitor DPCt and an inductor DPSL is connected in parallel with the diode DD1.

The cathode of a diode DD2 is connected to the diplexer 20 via an inductor DSL2 and to the second SAW duplexer 13D via a capacitor Cc. The anode of the diode DD2 is grounded via a capacitor DC5. The node of the anode of the diode DD2 and the capacitor DC5 is connected to a control terminal Vc2 via a resistor DR. The node of the control terminal Vc2 and the resistor DR is grounded via a capacitor C5.

In the second LC filter 12D, a parallel circuit including an inductor DLt1 and a capacitor DCc1 and a parallel circuit including an inductor DLt2 and a capacitor DCc2 are connected in series. Each of these parallel circuits preferably includes a low-pass filter. First sides of the inductors DLt1 and DLt2 are grounded via capacitors DCu1 and DCu2, respectively. A capacitor C6 arranged to cut a direct-current component is connected between the second LC filter 12D and the second transmission input terminal DCS1800/PCS1900Tx.

The second SAW duplexer 13D includes SAW filters 1800SAW and 1900SAW, inductors Ld and Lp, and capacitors Cd and Cp. The input side of the SAW filter 1800SAW is connected to the inductor DSL2 of the second high frequency switch 11D via the capacitors Cd and Cc and is grounded via the inductor Ld. The input side of the SAW filter 1900SAW is connected to the inductor DSL2 of the second high frequency switch 11D via the inductor Lp and the capacitor Cc and is grounded via the capacitor Cp.

The output sides of the SAW filters 1800SAW and 1900SAW are connected to the second reception balanced output terminals DCS1800Rx and PCS1900Rx via inductors L5 and L6, respectively. The inductors L5 and L6 are arranged to adjust the phases of the second reception balanced output terminals DCS1800Rx and PCS1900Rx, respectively.

Figure 2:
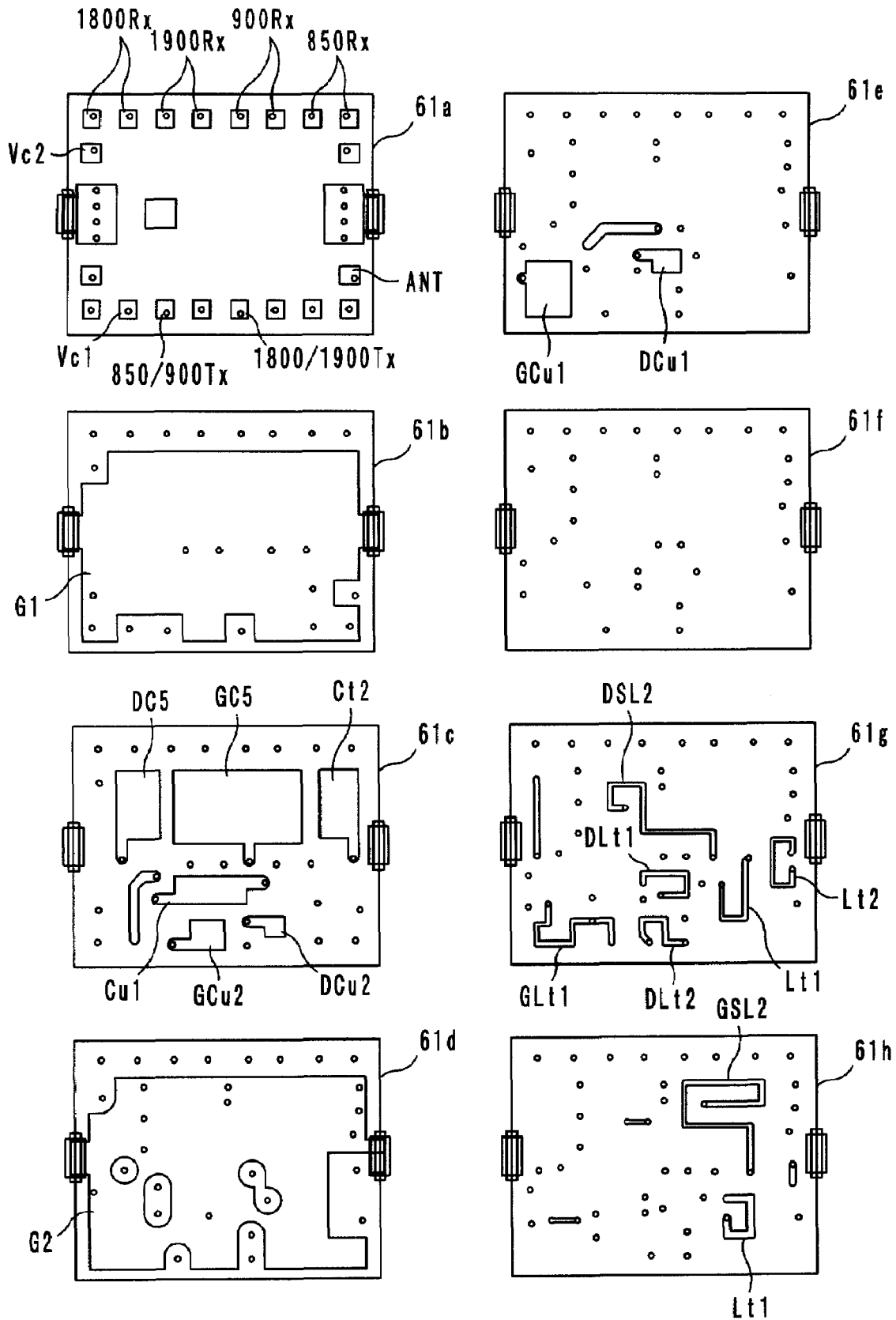
FIG. 2 is a diagram that illustrates the shape of electrodes formed on sheet layers (1st to 8th layers from the bottom) of a multilayer ceramic substrate according to the first preferred embodiment of the present invention.
Figure 3:
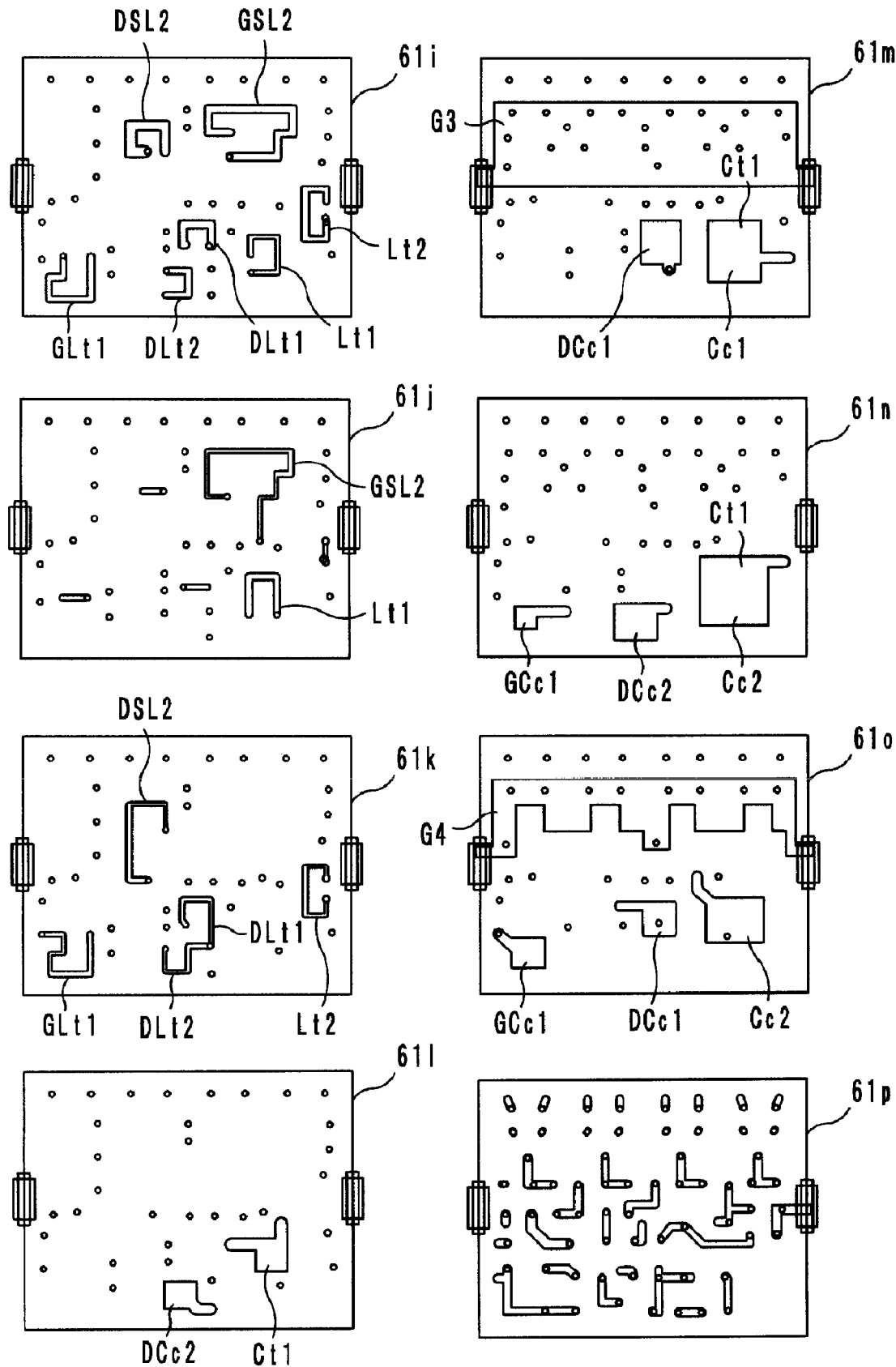
FIG. 3 is a diagram that illustrates the shape of electrodes formed on sheet layers (9th to 16th layers from the bottom) of the multilayer ceramic substrate according to the first preferred embodiment of the present invention.
Figure 4:
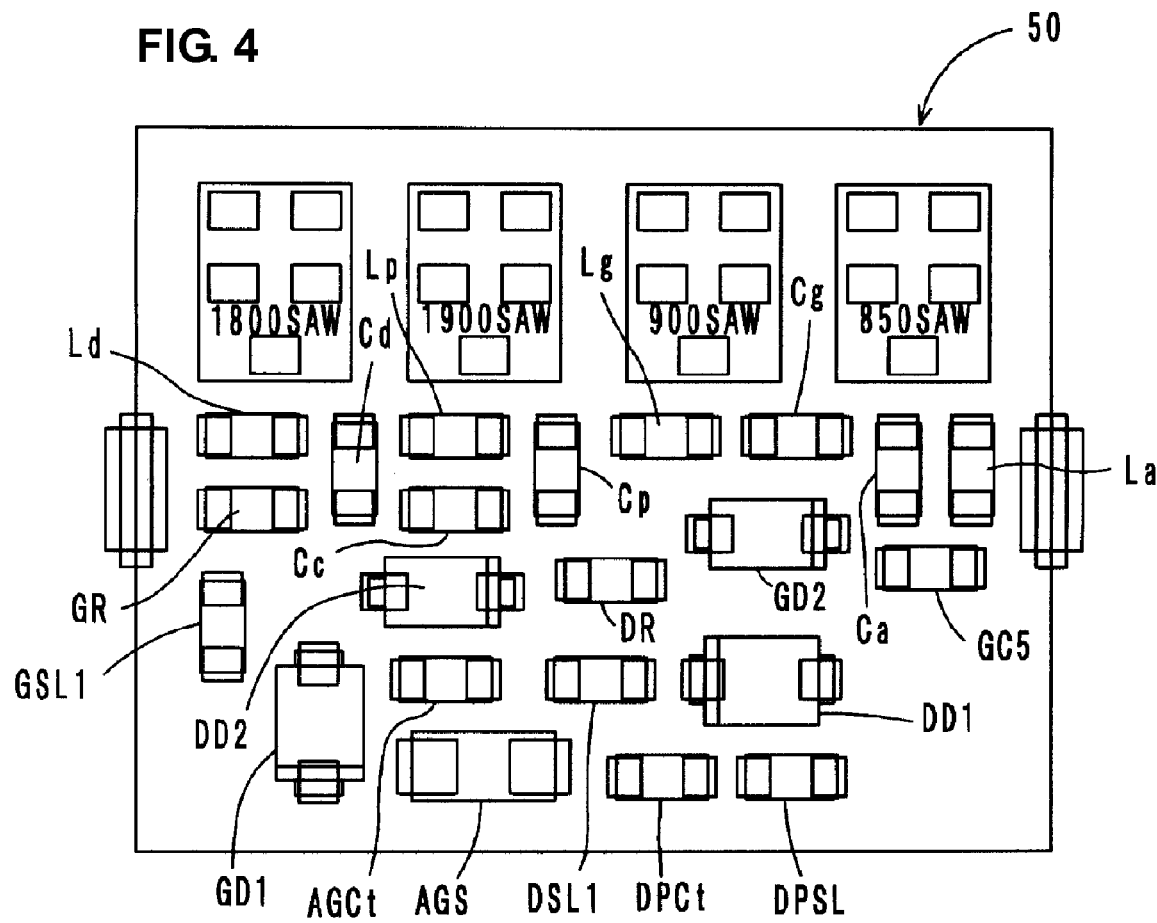
FIG. 4 is a plan view that illustrates the mounted state of circuit elements on the surface of the multilayer ceramic substrate according to the first preferred embodiment of the present invention.

FIGS. 2 and 3 illustrate capacitor electrodes, strip-line electrodes, and other components preferably formed by screen printing or another process on sheet layers of a multi-layer ceramic substrate 50 of the high frequency front-end module according to the first preferred embodiment. FIG. 4 illustrates elements formed on the multilayer ceramic substrate 50. The multilayer ceramic substrate 50 is formed by sequentially stacking from the bottom 1st to 16th sheet layers 61a to 61p made of ceramic whose primary ingredients are barium oxide, aluminum oxide, and silicon dioxide and firing the lamination at temperatures not exceeding about 1000° C., for example.

The first sheet layer 61a is provided with a plurality of terminal electrodes for external connection. The second sheet layer 61b is provided with a ground electrode G1. The third sheet layer 61c is provided with the electrodes of the capacitors DC5, GC5, Ct2, Cu1, GCu2, and DCu2. The capacitors DC5, GC5, Ct2, Cu1, GCu2, and DCu2 and the ground electrode G1 form capacitances. The fourth sheet layer 61d is provided with a ground electrode G2. The fifth sheet layer 61e is provided with the electrodes of the capacitors GCu1 and DCu2. The capacitors GCu1 and DCu2 and the ground electrode G2 form capacitances.

The seventh sheet layer 61g is provided with the inductors Lt1, Lt2, DLt1, DLt2, GLt1, and DSL2 defined by strip-line electrodes. The eighth sheet layer 61h is provided with the inductors Lt1 and GSL2 defined by strip-line electrodes. The ninth sheet layer 61i is provided with the inductors Lt1, Lt2, DLt1, DLt2, GLt1, DSL2, and GSL2 defined by strip-line electrodes. The 10th sheet layer 61j is provided with the inductors Lt1 and GSL2 defined by strip-line electrodes. The 11th sheet layer 61k is provided with the inductors Lt2, DLt1, DLt2, GLt1, and DSL2 defined by strip-line electrodes. Corresponding inductors of the sheet layers 61g to 61k are connected together through via-hole conductors.

The 12th sheet layer 61l is provided with the electrodes of the capacitors Ct1 and DCc2. The 13th sheet layer 61m is provided with the electrodes of the capacitors Ct1, Cc1, and DCc1 and a ground electrode G3. The 14th sheet layer 61n is provided with the electrodes of the capacitors Ct1, Cc2, GCc1, and DCc2. The 15th sheet layer 61o is provided with the electrodes of the capacitors Cc2, DCc1, and GCc1 and a ground electrode G4.

As illustrated in FIG. 4, the surface of the 16th sheet layer 61p is the surface of the multilayer ceramic substrate 50 and is provided with a plurality of terminal electrodes. On the surface, the SAW filters 1800SAW, 1900SAW, 900SAW, and 850SAW and the diodes GD1, GD2, DD1, and DD2 are mounted. In addition, the inductors AGS, GSL1, Lg, La, Ld, Lp, DPSL, and DSL1, the capacitors AGCt, Ca, Cg, GC5, DPCt, Cc, Cd, and Cp, and the resistors GR and DR are mounted thereon.

An operation of the high frequency front-end module according to the first preferred embodiment will now be described. To transmit a transmission signal of the DCS/PCS system, in the second high frequency switch 11D, applying, for example, about 3V to the control terminal Vc2 and turning on the diodes DD1 and DD2 cause a transmission signal of the DCS/PCS system to pass through the second LC filter 12D and the second high frequency switch 11D, to be input to the diplexer 20, and to be transmitted from the antenna terminal ANT.

At this time, the transmission signal of the GSM system is prevented from being transmitted by applying, for example, about 0V to the control terminal Vc1 in the first high frequency switch 11G of the GSM system and turning off of the diode GD1. A transmission signal of the DCS/PCS system does not enter the GSM system because the diplexer 20 is connected therebetween. In the second LC filter 12D of the DCS/PCS system, the second and third harmonics of the DCS/PCS system are attenuated.

To transmit a transmission signal of the GSM system, in the first high frequency switch 11G, applying, for example, about 3V to the control terminal Vc1 and turning on the diodes GD1 and GD2 cause a transmission signal of the GSM system to pass through the first LC filter 12G and the first high frequency switch 11G, to be input to the diplexer 20, and to be transmitted from the antenna terminal ANT.

At this time, the transmission signal of the DCS/PCS system is prevented from being transmitted by applying, for example, about 0V to the control terminal Vc2 in the second high frequency switch 11D of the DCS/PCS system and turning off of the diode DD1. A transmission signal of the GSM system does not enter the DCS/PCS system because the diplexer 20 is connected.

The second harmonic of the GSM system is attenuated by the low-pass filter defined by the capacitor Ct1, the inductor Lt1, and the shunt capacitor Cu1 in the diplexer 20. The third harmonic of the GSM system is attenuated by the first LC filter 12G of the GSM system.

To receive a reception signal for the DCS/PCS system and the GSM system, in the second high frequency switch 11D of the DCS/PCS system, for example, about 0V is applied to the control terminal Vc2 and the diodes DD1 and DD2 are turned off, and in the first high frequency switch 11G of the GSM system, for example, about 0V is applied to the control terminal Vc1 and the diodes GD1 and GD2 are turned off. This prevents a reception signal for the DCS/PCS system from entering the second transmission input terminal DCS1800/PCS1900Tx and prevents a reception signal for the GSM system from entering the first transmission input terminal GSM850/900Tx and enables signals input from the antenna terminal ANT to be output to the second reception balanced output terminals DCS1800Rx and PCS1900Rx of the DCS/PCS system and to the first reception balanced output terminals GSM850Rx and GSM900Rx of the GSM system. The reception signal for the DCS/PCS system does not enter the GSM system and the reception signal for the GSM system does not enter the DCS/PCS system because the diplexer 20 is provided.

In the high frequency front-end module according to the first preferred embodiment described above, the high-pass filter defined by the capacitor Ca and the inductor La and the high-pass filter defined by the capacitor Cg and the inductor Lg, each of the high-pass filters functioning as a phase-matching element having an anti-surge function that has the function of removing a surge, are disposed between the SAW filter 850SAW and the first high frequency switch 11G and between the SAW filter 900SAW and the first high frequency switch 11G, respectively. Therefore, when a surge enters the reception signal path in the GSM system from the antenna terminal ANT, the surge is removed by the high-pass filters, which enables the SAW filters 850SAW and 900SAW to be protected against the surge. In this case, an anti-surge element can be omitted in the antenna terminal ANT, and signal loss does not occur. The phase matching function and anti-surge function are performed without an additional element.

The cut-off frequency of the phase-matching element having an anti-surge function (high-pass filter) may preferably be about 200 MHz to about 600 MHz. The frequency of a surge is typically about 200 MHz to about 600 MHz (in particular, approximately 300 MHz), so it is preferable that the cut-off frequency of the high-pass filter be at this frequency band.

The phase-matching elements having an anti-surge function (high-pass filters) include the capacitors Ca and Cg, which are disposed adjacent to the first high frequency switch 11G, and the inductors La and Lg, which are disposed adjacent to the SAW filters 850SAW and 900SAW. Therefore, the capacitors Ca and Cg function as a capacitor that cuts a DC component.

The diplexer 20, the high frequency switches 11G and 11D, the LC filters 12G and 12D, and the SAW duplexer 13G and 13D are integrated in the multilayer substrate 50 in which dielectric layers are laminated. Therefore, the module can be miniaturized. Moreover, the addition of another impedance-matching element can be omitted by realizing the impedance matching between the functional elements during the integration.

The first LC filter 12G including the capacitor GCc1 and the inductor GLt1 is disposed in the transmission signal path in the GSM system. The capacitor GCc1 and the inductor GLt1 are included in the multilayer substrate 50 and arranged so as not to overlap the phase-matching elements having an anti-surge function (capacitors Ca and Cg and inductors La and Lg) in plan view along the laminating direction of the multilayer substrate 50. If a transmission signal is sent to the reception signal path, a reception signal cannot be processed properly, and the SAW filters 850SAW and 900SAW may be damaged or destroyed. Signal crosstalk is suppressed by arranging the elements defining the first LC filter 12G so as not to overlap the phase-matching elements having an anti-surge function in plan view, irrespective of whether the functional elements are disposed internally or externally to the multilayer substrate.

Second Preferred Embodiment

Figure 5:
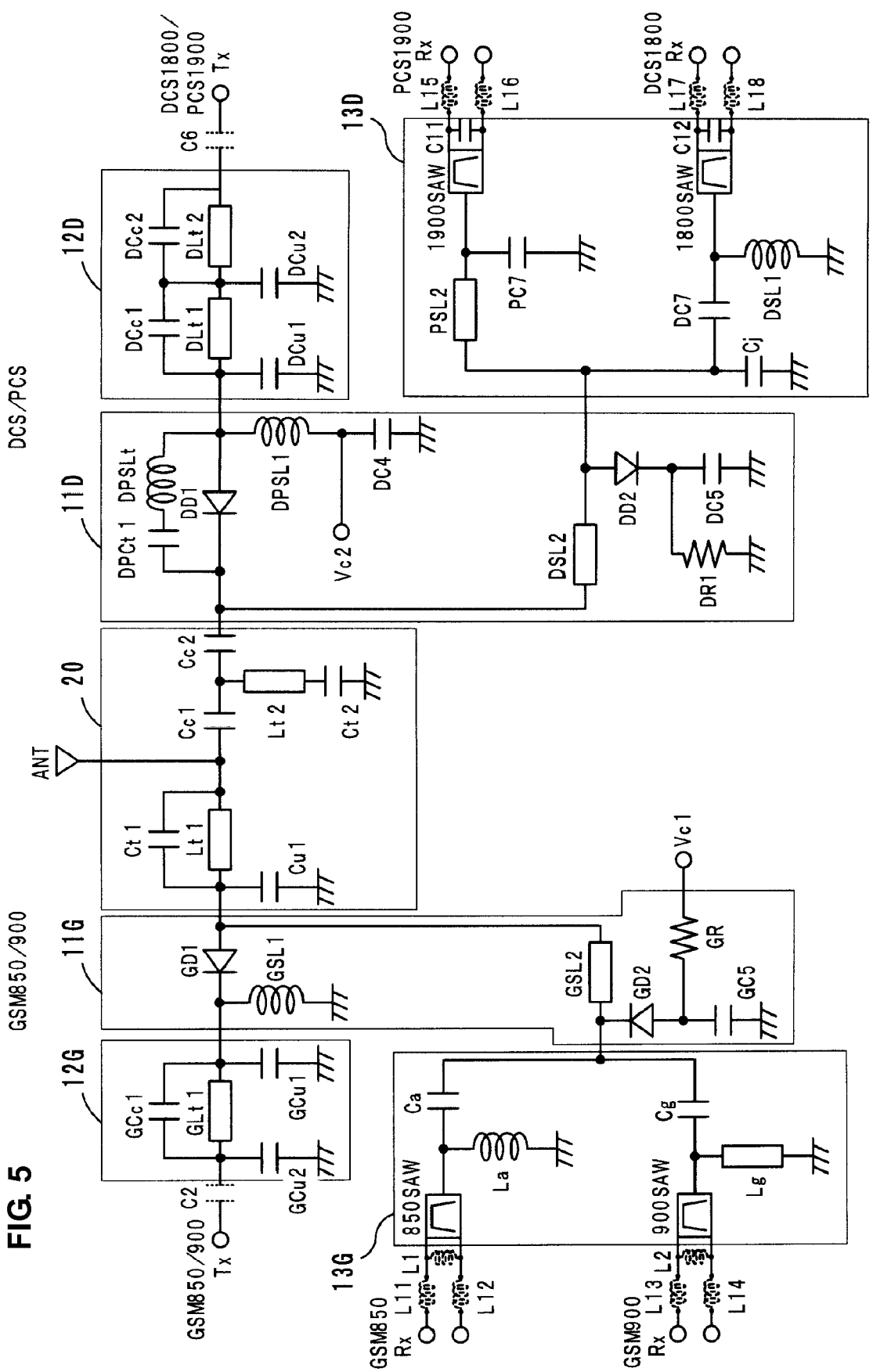
FIG. 5 is an equivalent circuit diagram that illustrates a high frequency front-end module according to a second preferred embodiment of the present invention.

A high frequency front-end module according to a second preferred embodiment is configured as a quad-band high frequency composite component (high frequency front-end module) similar to that in the first preferred embodiment, as shown in an equivalent circuit of FIG. 5. Therefore, the fundamental structure of the second preferred embodiment is preferably substantially the same as in the first preferred embodiment. In FIG. 5, the same reference numerals are used for the same elements as in FIG. 1, and description thereof is omitted.

The second preferred embodiment differs from the first preferred embodiment in the first and second high frequency switch 11G and 11D and the first and second SAW duplexers 13G and 13D.

In the first high frequency switch 11G, the series circuit defined by the capacitor AGCt and the inductor AGS is omitted.

In the second high frequency switch 11D, the cathode of the diode DD1 is connected to the diplexer 20 and the anode of the diode DD1 is connected to the second LC filter 12D and is grounded via an inductor DPSL1 and a capacitor DC4. The node of the inductor DPSL1 and the capacitor DC4 is connected to the control terminal Vc2. A series circuit defined by a capacitor DPCt1 and an inductor DPSLt is connected in parallel with the diode DD1. The anode of the diode DD2 is connected to the diplexer 20 via the inductor DSL2. The cathode of the diode DD2 is grounded via the capacitor DC5 and grounded via a resistor DR1.

In the first SAW duplexer 13G, the output sides of the SAW filters 850SAW and 900SAW are connected to the first reception balanced output terminals GSM850Rx and GSM900Rx via the inductors L1 and L2 such that inductors L11 to L14 are connected in series with the first reception balanced output terminals GSM850Rx and GSM900Rx.

In the second SAW duplexer 13D, the input side of the SAW filter 1900SAW and the input side of the SAW filter 1800SAW are connected to the inductor DSL2 of the second high frequency switch 11D via an inductor PSL2 and a capacitor DC7, respectively, and are grounded via a capacitor Cj. The input side of the SAW filter 1900SAW is grounded via a capacitor PC7. The input side of the SAW filter 1800SAW is grounded via an inductor DSL1.

The output side of the SAW filter 1900SAW and the output side of the SAW filter 1800SAW are connected to the second reception balanced output terminals DCS1800Rx and PCS1900Rx via capacitors C11 and C12, respectively, such that inductors L15 to L18 are connected in series with the second reception balanced output terminals DCS1800Rx and PCS1900Rx.

Figure 6:
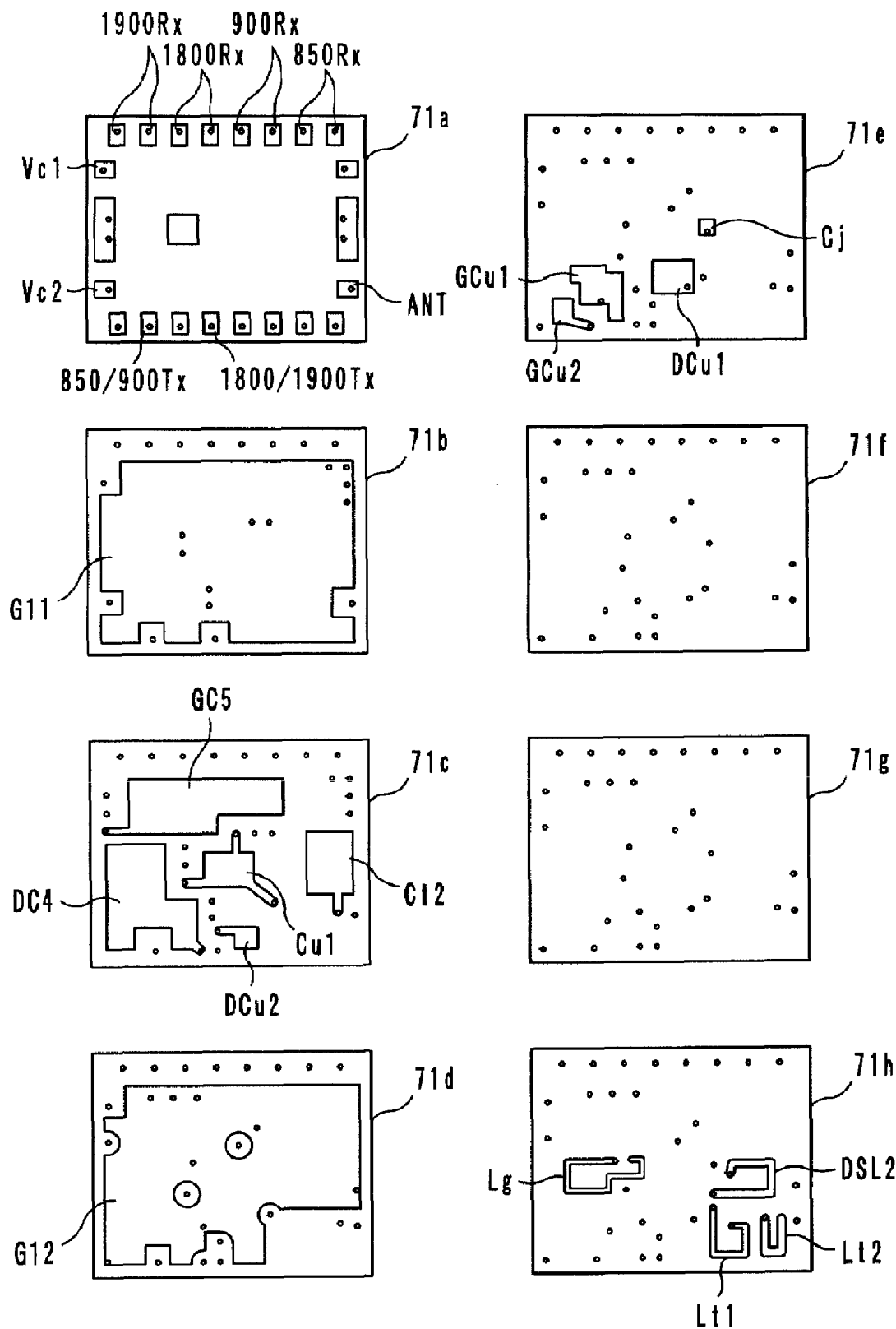
FIG. 6 is a diagram that illustrates the shape of electrodes formed on sheet layers (1st to 8th layers from the bottom) of a multilayer ceramic substrate according to the second preferred embodiment of the present invention.
Figure 7:
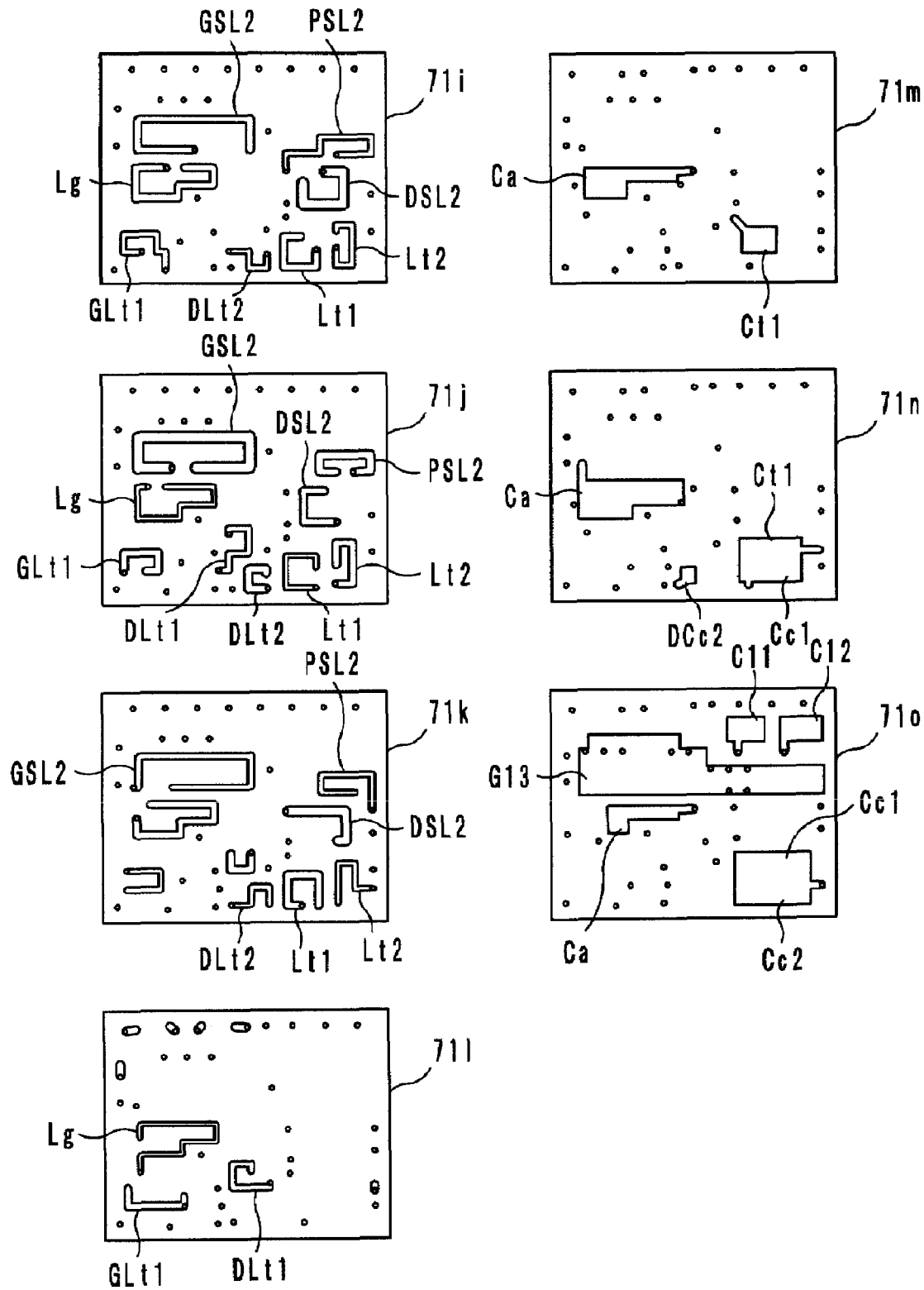
FIG. 7 is a diagram that illustrates the shape of electrodes formed on sheet layers (9th to 15th layers from the bottom) of the multilayer ceramic substrate according to the second preferred embodiment of the present invention.
Figure 8:
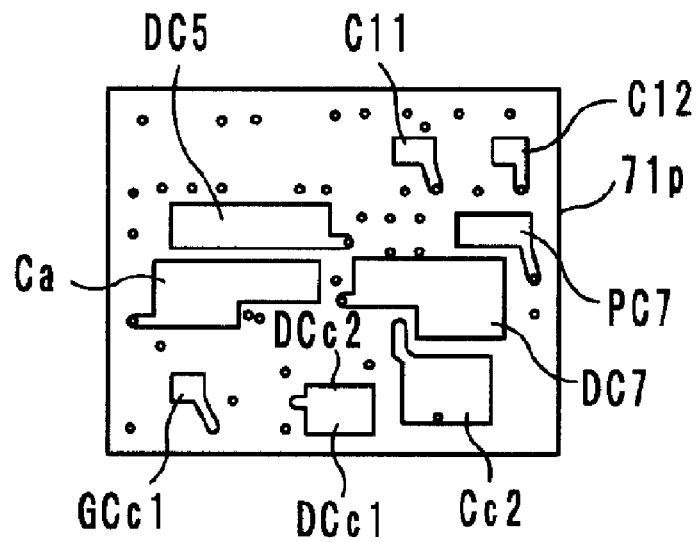
FIG. 8 is a diagram that illustrates the shape of electrodes formed on sheet layers (16th to 18th layers from the bottom) of the multilayer ceramic substrate according to the second preferred embodiment of the present invention.
Figure 8:
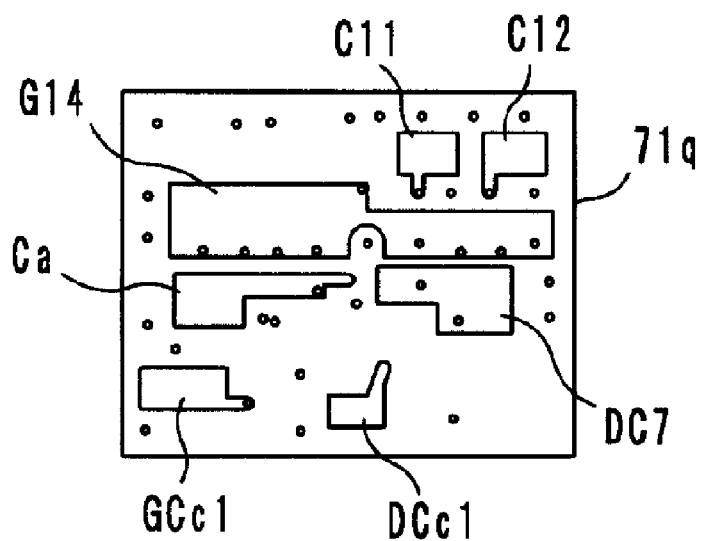
Figure 8:
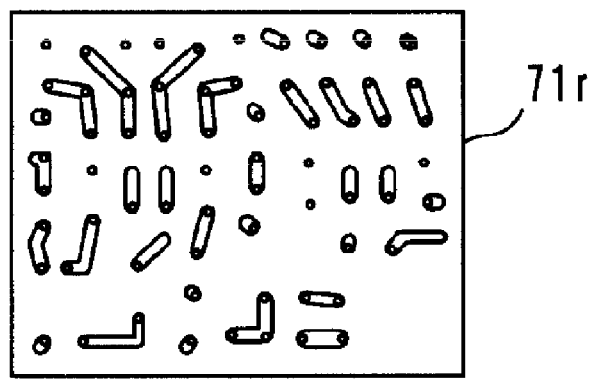
Figure 9:
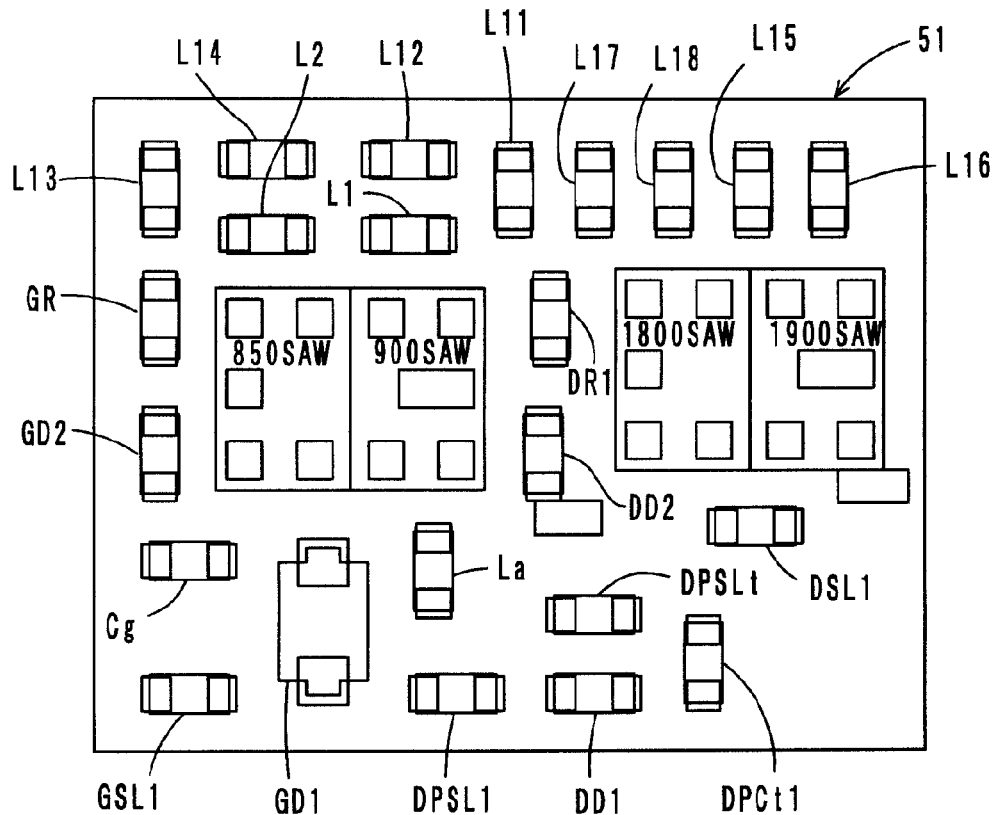
FIG. 9 is a plan view that illustrates the mounted state of circuit elements on the surface of the multilayer ceramic substrate according to the second preferred embodiment of the present invention.

FIGS. 6 to 8 illustrate capacitor electrodes, strip-line electrodes, and other components preferably formed by screen printing or another process on sheet layers of a multilayer ceramic substrate 51 of the high frequency front-end module according to the second preferred embodiment. FIG. 9 illustrates elements formed on the multilayer ceramic substrate 51. The multilayer ceramic substrate 51 is formed by sequentially stacking from the bottom 1st to 18th sheet layers 71a to 71r made of ceramic whose primary ingredients are barium oxide, aluminum oxide, and silicon dioxide and firing the lamination at temperatures not exceeding about 1000° C., for example.

The first sheet layer 71a is provided with a plurality of terminal electrodes for external connection. The second sheet layer 71b is provided with a ground electrode G11. The third sheet layer 71c is provided with the electrodes of the capacitors GC5, DC4, Cu1, DCu2, and Ct2. The capacitors GC5, DC4, Cu1, DCu2, and Ct2 and the ground electrode G11 form capacitances. The fourth sheet layer 71d is provided with a ground electrode G12. The fifth sheet layer 71e is provided with the electrodes of the capacitors GCu1, GCu2, Cj, and DCu1. The capacitors GCu1, GCu2, Cj, and DCu1 and the ground electrode G12 form capacitances.

The eighth sheet layer 71h is provided with the inductors Lg, DSL2, Lt1, and Lt2 defined by strip-line electrodes. The ninth sheet layer 71i is provided with the inductors Lg, GSL2, GLt1, PSL2, DSL2, DLt2, Lt1, and Lt2 defined by strip-line electrodes. The 10th sheet layer 71j is provided with the inductors Lg, GSL2, GLt1, PSL2, DSL2, DLt1, DLt2, Lt1, and Lt2 defined by strip-line electrodes. The 11th sheet layer 71k is provided with the inductors GSL2, PSL2, DSL2, DLt2, Lt1, and Lt2 defined by strip-line electrodes. The 12th sheet layer 71l is provided with the inductors Lg, GLt1, and DLt1 defined by strip-line electrodes. Corresponding inductors of the sheet layers 71h to 71l are connected together through via-hole conductors.

The 13th sheet layer 71m is provided with the electrodes of the capacitors Ca and Ct1. The 14th sheet layer 71n is provided with the electrodes of the capacitors Ca, Ct1, Cc1, and DCc2. The 15th sheet layer 71o is provided with the electrodes of the capacitors Ca, C11, C12, Cc1, and Cc2 and a ground electrode G13. The 16th sheet layer 71p is provided with the electrodes of the capacitors Ca, C11, C12, DC5, PC7, DC7, GCc1, DCc1, DCc2, and Cc2. The 17th sheet layer 71q is provided with the electrodes of the capacitors Ca, C11, C12, DC7, GCc1, and DCc1 and a ground electrode G14.

As illustrated in FIG. 9, the surface of the 18th sheet layer 71r is the surface of the multilayer ceramic substrate 51 and is provided with a plurality of terminal electrodes for connection. On the surface, the SAW filters 1800SAW, 1900SAW, 900SAW, and 850SAW and the diodes GD1, GD2, DD1, and DD2 are mounted. In addition, the inductors L13, L14, L11, L12, L1, L2, L15, L16, L17, L18, La, GSL1, DPCt1, DPSL1, DSL1, and DPSLt, the capacitor Cg, and the resistors GR and DR1.

The fundamental operation of the second preferred embodiment is substantially the same as in the first preferred embodiment. Redundant description thereof is omitted. The basic operational advantages are also substantially the same as in the first preferred embodiment. In particular, the second preferred embodiment is similar to the first preferred embodiment in that each of the two high-pass filters in the first SAW duplexer 13G has both the function of removing a surge entering from the antenna terminal ANT and the phase-matching function.

Each of the SAW filters 900SAW and 850SAW is a balanced SAW filter having two balanced output terminals, and the impedance-matching elements (L1, L2, and L11 to L14) for matching the impedance between the output terminals are disposed between the two balanced output terminals. The SAW filters 900SAW, 850SAW, 1800SAW, and 1900SAW, the impedance-matching elements L1, L2, and L11 to L18, and the phase-matching elements La and Cg having an anti-surge function are mounted as chip components on the same surface of the multilayer ceramic substrate 51. The SAW filters 900SAW, 850SAW, 1800SAW, and 1900SAW are disposed between the phase-matching elements La and Cg having an anti-surge function and the impedance-matching elements L1, L2, and L11 to L18. If a matching element, such as the impedance-matching elements L1, L2, and L11 to L18 and the phase-matching elements La and Cg, is electromagnetically affected by other components, the impedance or phase is displaced, such that predetermined functions are not fully performed. To avoid this, the SAW filters, which have a relatively large size, are disposed between the functional elements, thereby minimizing interference between the matching elements.

Third Preferred Embodiment

Figure 10:
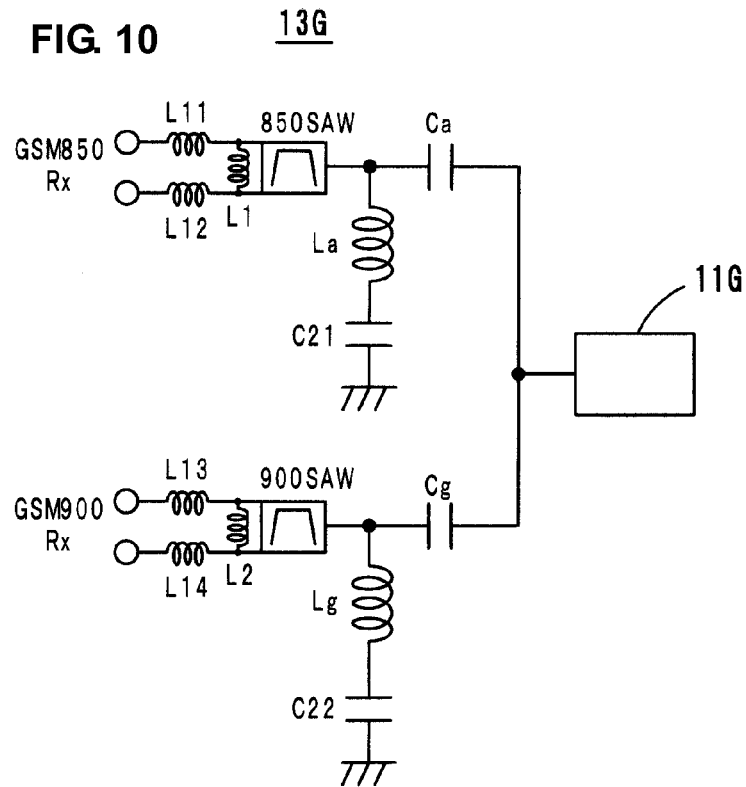
FIG. 10 is an equivalent circuit diagram that illustrates an essential portion of a high frequency front-end module according to a third preferred embodiment of the present invention.

In a high frequency front-end module according to a third preferred embodiment as shown in FIG. 10, the high-pass filters of the first SAW duplexer 13G in the second preferred embodiment are defined by LC series resonant circuits (the inductor La and a capacitor C21 and the inductor Lg and a capacitor C22) arranged between the input sides of the SAW filters 850SAW and 900SAW and the ground, as illustrated in an equivalent circuit of an essential portion thereof in FIG. 10. The inclusion of the LC series resonant circuits adds a notch function produced by series resonance to the phase-matching elements having an anti-surge function, such that an attenuation pole can be produced in a frequency band of a surge. Accordingly, the effects of cutting off surges are further improved. It is of course to be noted that this structure is also applicable to the first preferred embodiment.

Fourth Preferred Embodiment

Figure 11:
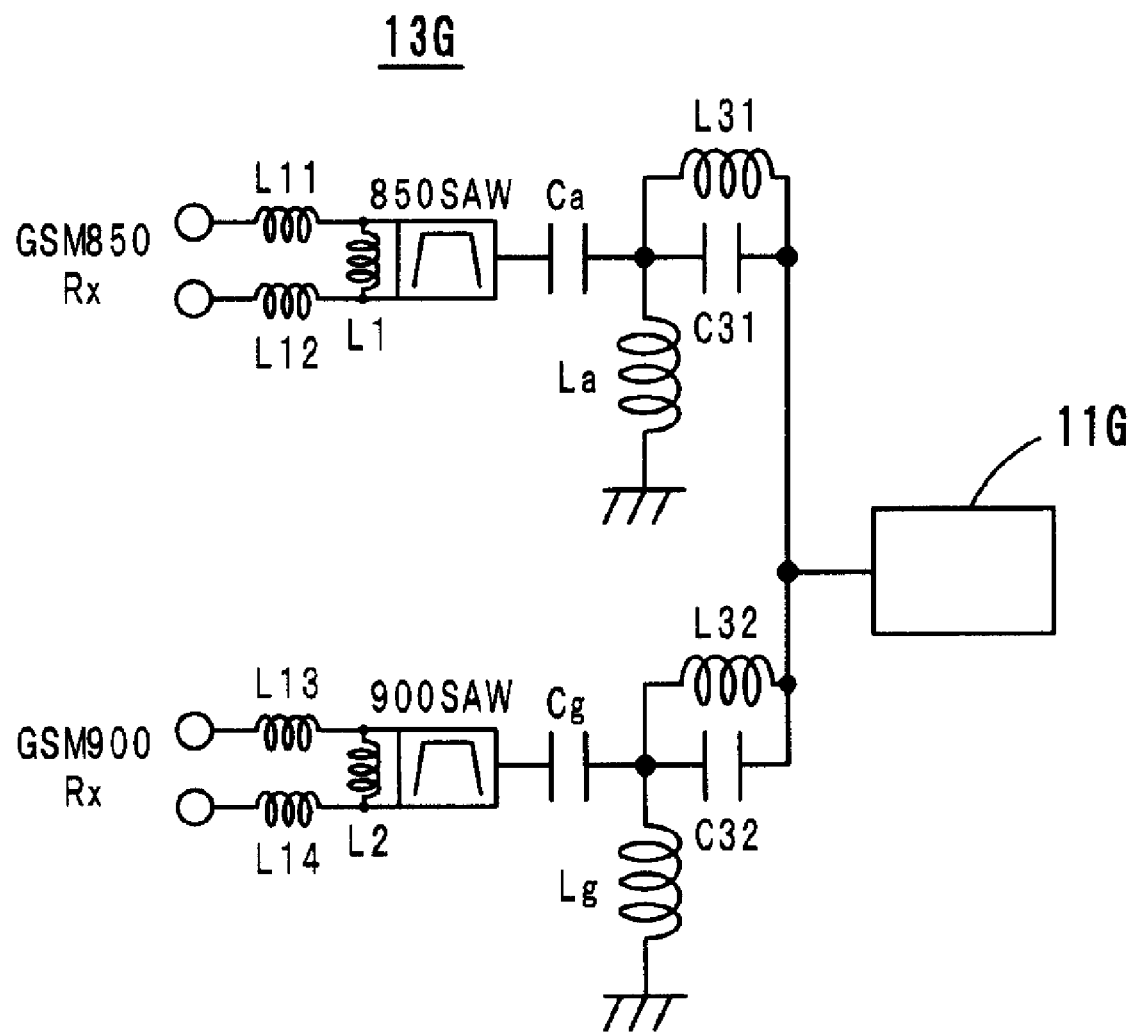
FIG. 11 is an equivalent circuit diagram that illustrates an essential portion of a high frequency front-end module according to a fourth preferred embodiment of the present invention.
Figure 12A:
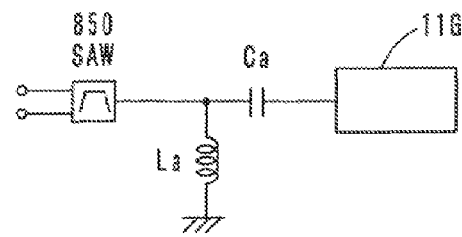
FIG. 12A is an equivalent circuit diagram that illustrates a phase-matching element having an anti-surge function according to the first preferred embodiment of the present invention.
Figure 12B:
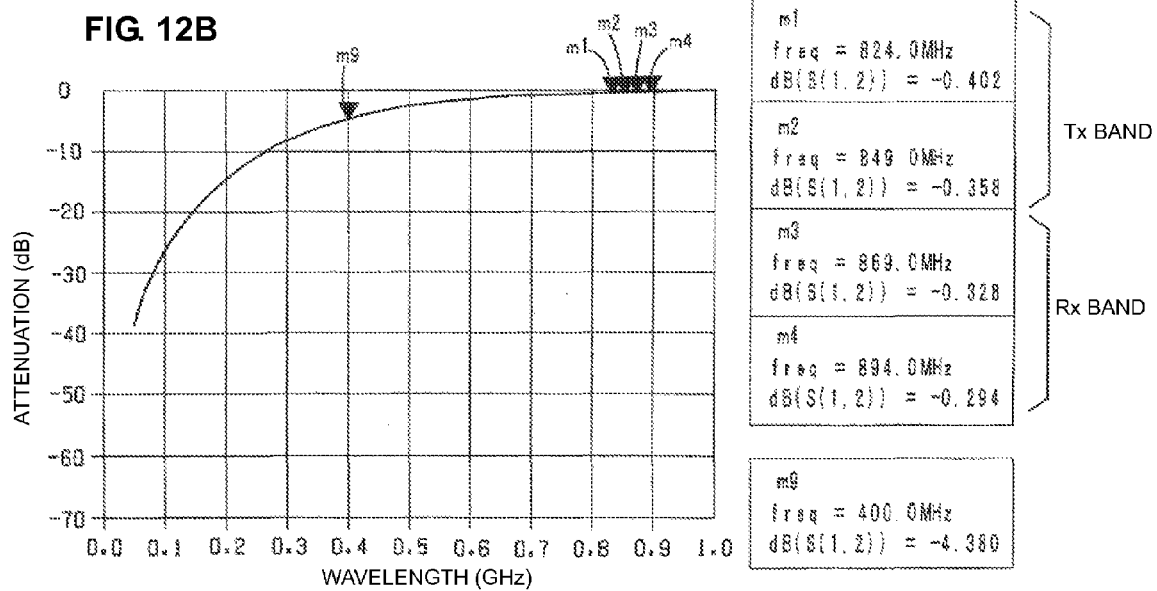
FIG. 12B is a graph showing attenuation characteristics thereof.

In a high frequency front-end module according to a fourth preferred embodiment as shown in FIG. 11, the high-pass filters of the first SAW duplexer 13G in the second preferred embodiment are defined by LC parallel resonant circuits (an inductor L31 and a capacitor C31 and an inductor L32 and a capacitor C32) arranged at the input sides of the SAW filters 850SAW and 900SAW, as illustrated in an equivalent circuit of an essential portion thereof in FIG. 11. The inclusion of the LC parallel resonant circuits adds a notch function produced by parallel resonance to the phase-matching elements having an anti-surge function, so an attenuation pole can be produced in a frequency band of a surge. Accordingly, the effects of cutting off surges are further improved. It is of course to be noted that this structure is applicable to the first preferred embodiment.

Modification of High-Pass Filter The high-pass filter functioning as the phase-matching element having an anti-surge function is configured as an equivalent circuit illustrated in FIG. 12A and has attenuation characteristics as shown in FIG. 12B (attenuating a surge of about 200 MHz to about 400 MHz to a reception signal of about 850 MHz). However, it is difficult to entirely cut a transmission signal when the transmission signal enters.

Figure 13A:
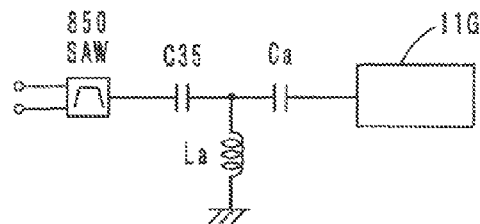
FIG. 13A is an equivalent circuit diagram that illustrates a phase-matching element having an anti-surge function according to a modification of the first preferred embodiment of the present invention.
Figure 13B:
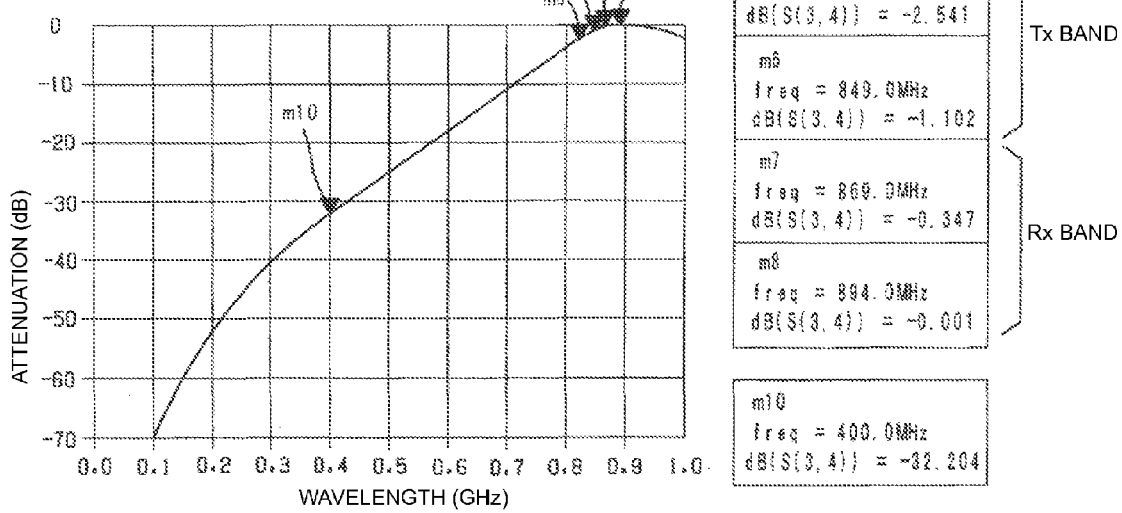
FIG. 13B is a graph showing attenuation characteristics thereof.

Accordingly, as illustrated in FIG. 13A, a capacitor C35 is preferably included in the reception signal path of the GSM850 system and the high-pass filter is preferably configured as a T-shaped high-pass filter defined by the two capacitors Ca and C35 and the inductor La connected in shunt between the two capacitors. In this case, the high-pass filter has attenuation characteristics as shown in FIG. 13B. Thus, a surge of about 200 MHz to about 400 MHz can be significantly attenuated, and moreover, a transmission signal entering the reception signal path can also be cut.

As a rule, for a transmission signal and a reception signal in the same system, a transmission-signal band (Tx band) is set to be higher than a reception-signal band (Rx band). Even if a transmission signal enters the reception signal path, the level of the entering transmission signal can be reduced by using the high-pass filter disposed downstream (at the reception side) of the high frequency switch 11G. In particular, because attenuation performed by the T-shaped high-pass filter is sharp, the amount of reduction in the signal level of a transmission signal is significant.

The high frequency front-end module and the duplexer according to the present invention are not limited to the preferred embodiments described above. It is of course to be understood that various changes and modifications may be made within the scope of the invention.

In particular, the phase-matching element having an anti-surge function (high-pass filter) may be a band-pass filter as long as it has a pass band that allows a signal of the GSM system to pass therethrough and an attenuation band that is in the frequency band of a surge. The SAW filter may be a bulk-acoustic wave (BAW) filter. In addition, the multilayer substrate in which the elements of the high frequency front-end module are incorporated may be one in which a plurality of resin layers are laminated, instead of one in which a plurality of dielectric layers are laminated.

As described above, various preferred embodiments of the present invention are useful for a high frequency front-end module that processes high frequency transmission and reception signals of different frequency bands and a duplexer that branches a plurality of reception signals of different frequency bands. In particular, a surge can be prevented from entering a reception-signal output terminal on a lower side without having to provide an anti-surge element in an antenna terminal.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A high frequency front-end module that processes first and second high frequency transmission and reception signals having different frequency bands, a frequency band of the first high frequency transmission and reception signals being lower than a frequency band of the second high frequency transmission and reception signals, the high frequency front-end module comprising:
a diplexer arranged to branch a first signal path between an antenna terminal and a processor for the first high frequency transmission and reception signals and a second signal path between the antenna terminal and a processor for the second high frequency transmission and reception signals;
a first high frequency switch disposed in the first signal path and arranged to switch a reception signal path for a first high frequency reception signal of the first high frequency transmission and reception signals and a transmission signal path for a first high frequency transmission signal of the first high frequency transmission and reception signals;
an acoustic wave filter disposed in the reception signal path of the first signal path and downstream of the first high frequency switch and having a pass band that allows the first high frequency reception signal to pass therethrough; and
a phase-matching element having an anti-surge function disposed between the acoustic wave filter and the first high frequency switch and having a function of matching a phase between the acoustic wave filter and the first high frequency switch and a function of removing a surge; wherein
the diplexer, the first high frequency switch, the acoustic wave filter, and the phase-matching element having an anti-surge function are integrated in a laminated structure in which a plurality of dielectric layers are laminated;
an LC filter defined by a capacitor and an inductor is disposed in the transmission signal path of the first signal path; and
at least one of the capacitor and the inductor defining the LC filter is included in the laminated structure, and the capacitor and the inductor are disposed so as not to overlap the phase-matching element having an anti-surge function in plan view along a laminating direction of the laminated structure.

2. The high frequency front-end module according to claim 1, wherein the phase-matching element having an anti-surge function is defined by a high-pass filter including a capacitor and an inductor.

3. The high frequency front-end module according to claim 2, wherein a cut-off frequency of the high-pass filter is about 200 MHz to about 600 MHz.

4. The high frequency front-end module according to claim 2, wherein the high-pass filter is defined by an LC series resonant circuit arranged between the reception signal path of the first signal path and a ground.

5. The high frequency front-end module according to claim 2, wherein the high-pass filter is defined by an LC parallel resonant circuit arranged in the reception signal path of the first signal path.

6. The high frequency front-end module according to claim 2, wherein the high-pass filter includes a capacitor adjacent to the first high frequency switch and a shunt inductor adjacent to the acoustic wave filter.

7. The high frequency front-end module according to claim 2, wherein the high-pass filter is a T-shaped high-pass filter including two capacitors disposed in the reception signal path of the first signal path and an inductor connected in shunt between the two capacitors.

8. The high frequency front-end module according to claim 1, wherein
the first high frequency reception signal of the first high frequency transmission and reception signals further comprises a first A reception signal and a first B reception signal;
the acoustic wave filter is defined by an acoustic wave duplexer that includes a first acoustic wave filter having a pass band that allows the first A reception signal to pass therethrough and a second acoustic wave filter having a pass band that allows the first B reception signal to pass therethrough;
the phase-matching element having an anti-surge function comprises a first phase-matching element having an anti-surge function provided to the first acoustic wave filter and a second phase-matching element having an anti-surge function provided to the second acoustic wave filter; and
the first phase-matching element having an anti-surge function is set so as to be open to the first B reception signal when viewed from a branch point of the first high frequency switch and the second phase-matching element having an anti-surge function to the first acoustic wave filter, and the second phase-matching element having an anti-surge function is set so as to be open to the first A reception signal when viewed from a branch point of the first high frequency switch and the first phase-matching element having an anti-surge function to the second acoustic wave filter.

9. The high frequency front-end module according to claim 1, wherein the acoustic wave filter is one of a surface acoustic wave filter and a bulk acoustic wave filter.

10. The high frequency front-end module according to claim 1, wherein
the acoustic wave filter is a balanced acoustic wave filter including two balanced output terminals, and an impedance-matching element arranged to match impedance between the output terminals is disposed between the two balanced output terminals;
the acoustic wave filter, the impedance-matching element, and the phase-matching element having an anti-surge function are defined by chip components mounted on a common surface of the laminated structure; and
the acoustic wave filter is disposed between the phase-matching element having an anti-surge function and the impedance-matching element.

* * * * *